(12) United States Patent
Poplevine et al.

(10) Patent No.: US 6,618,282 B1
(45) Date of Patent: Sep. 9, 2003

(54) HIGH DENSITY ROM ARCHITECTURE WITH INVERSION OF PROGRAMMING

(75) Inventors: Pavel Poplevine, Foster City, CA (US); Hengyang Lin, San Jose, CA (US); Andrew J. Franklin, Santa Clara, CA (US); Umer Ahmed Khan, Fremont, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/213,845

(22) Filed: Aug. 7, 2002

(51) Int. Cl.[7] .............................. G11C 17/00; G11C 7/00
(52) U.S. Cl. ......................... 365/94; 365/196; 365/203
(58) Field of Search ........................... 365/230.03, 196, 365/203, 207, 205, 94, 241

(56) References Cited

U.S. PATENT DOCUMENTS

| | | | |
|---|---|---|---|
| 4,426,686 A | 1/1984 | Yamamoto et al. | 365/104 |
| 5,477,484 A | 12/1995 | Nakashima | 365/182 |
| 5,598,365 A * | 1/1997 | Shoji | 365/104 |
| 5,703,820 A | 12/1997 | Kohno | 365/204 |
| 5,745,401 A | 4/1998 | Lee | 365/104 |
| 5,787,033 A | 7/1998 | Maeno | 365/182 |
| 5,930,180 A | 7/1999 | Callahan | 365/189.09 |
| 6,363,001 B1 | 3/2002 | Borot et al. | 365/104 |
| 6,492,694 B2 * | 12/2002 | Noble et al. | 257/410 |

* cited by examiner

*Primary Examiner*—Thong Le
(74) *Attorney, Agent, or Firm*—Stallman & Pollock LLP

(57) ABSTRACT

A ROM system which provides for reduced size and power consumption. This ROM systems allows for inverting the programming and sensing of information in bit cells of the ROM to reduce the number of transistors in bit cells of the ROM. Further bit cells of the ROM provide that a first type of information is stored in the bit cell when a transistor is disposed between a bit line and a word line, and a second type of information is stored in the cell when no transistor is disposed between the bit line and the word line. In the bit cell a contact between a bit line and a region where a transistor drain can be formed in a substrate is provided in those instances when a transistor is formed between the bit line and a word line. In those instances when a bit cell provides no transistors between the word line and the bit line, no contact is provided between the bit line and the region where a transistor drain can be formed.

17 Claims, 14 Drawing Sheets

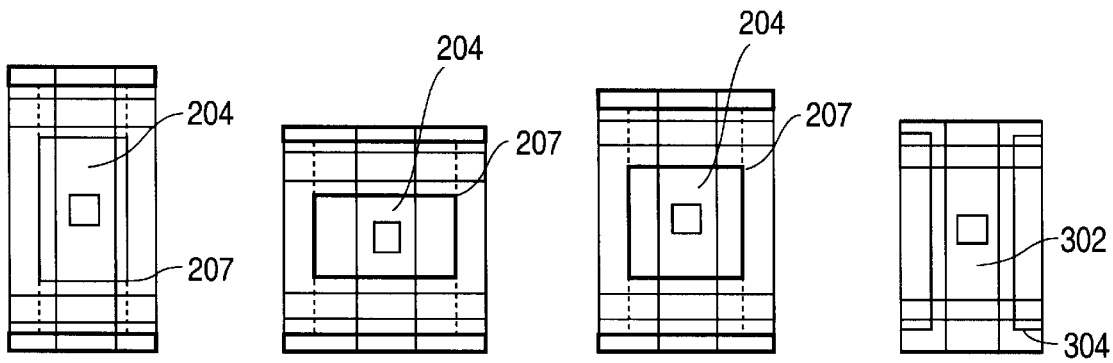
FIG. 3a
(PRIOR ART)
FIG. 3b
(PRIOR ART)
FIG. 3c
(PRIOR ART)
FIG. 3d
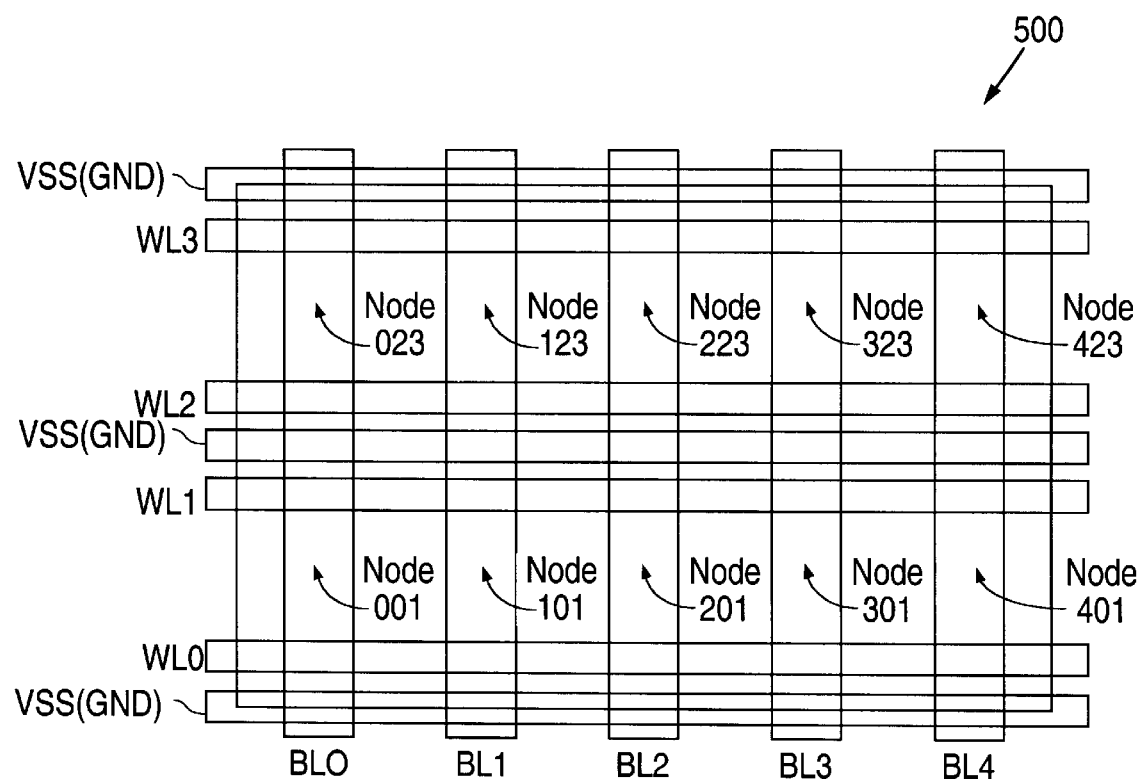
FIG. 4a

US 6,618,282 B1

HIGH DENSITY ROM ARCHITECTURE WITH INVERSION OF PROGRAMMING

TECHNICAL FIELD

The present invention relates to the field of read only memory (ROM) cells, and ROM memory architecture providing for a high density and low power consumption.

BACKGROUND OF THE INVENTION

The present invention is directed to a ROM memory device. A ROM is a read only memory device which programmed during an integrated circuit manufacturing process. Once the ROM has been programmed the data in the ROM is fixed such that the data stored in the ROM can be read, but it cannot be changed. FIG. 1 shows a ROM memory array architecture 100 of the prior art. This architecture includes an array 100 of bit cells, where each bit cell corresponds to an area between a bit line (BL0–BL4) and a word line (WL0–WL3). The ROM array 100 is programmed with a combination of ones (1) and zeros (0). In many prior systems a zero (0) is stored in a bit cell of the ROM array 100 by providing an NMOS transistor between a bit line and a word line. For example, by virtue of the fact that a transistor T10 is formed between the bit line BL0 and word line WL1 a 0 is stored in the corresponding bit cell. The word line acts as a gate for NMOS transistor T10 and is electrically coupled to the channel region of the transistor through a dielectric layer such as silicon oxide. The drain of the NMOS transistor T10 is coupled to the bit line BL0.

To sense whether a bit cell contains either a 0 or 1, a voltage is applied to the word line and if a transistor is coupled between the bit line and the word line at the bit cell being read, then current flows from the bit line through the transistor to ground. The detection of current through the NMOS transistor is achieved using a sensing circuit coupled to the bit line. Typically the presence of a transistor coupled between the word line and the bit line, which results in current flow being sensed on the bit line when a voltage is applied to the word line, corresponds to a 0 being stored in the bit cell.

A prior art diffusion ROM array 200 layout is shown in FIG. 2a. The prior art diffusion array 200 shows an array which has not been programmed—or it could be viewed as a diffusion array where all of the bit cells are programmed such that there are no transistors coupling any of the bit lines to any of the word lines, and hence all of the bit cells are programmed such that they store a data bit of 1. The operation of these ROMs is more clearly illustrated in connection with FIG. 2b below.

The layout shown in FIG. 2b shows a prior art diffusion ROM 201 where N+ diffusion has been used to program the ROM such that it corresponds to the architecture shown in FIG. 1. The word lines (WL0–WL3) are typically formed of polysilicon. The contacts 202 which are present for each bit cell (see, Node 001 thru Node 423 where each node corresponds to two bit cells) are also typically formed of using a metal interconnect to the N+ node diffusion area. Each node has a first region 204, which is a node diffusion region that is used to form a drain region. It should be noted that, as shown in FIG. 2a, the node diffusion region 204 is present at each node regardless of whether a transistor has been formed to couple the bit line to a word line.

Each of the bit cells is coupled to one of the bit lines (BL0–BL4) by a contact 202. Again it should be noted that, as shown in FIG. 2a, the contact 202 coupling the bit line to a node diffusion region is present at each node regardless of whether a transistor has been formed to couple the bit line to a word line. The bit lines are typically formed of metal. The VSS (Gnd) lines are typically formed using N+ diffusion into the P type substrate 203.

In the prior art diffusion ROM 201 (FIG. 2b) an NMOS transistor can be formed at any of the nodes of the ROM by extending the N+ diffusion from the node diffusion area 204 through the contact 202 connected to the bit line. Specifically, as shown in FIG. 2b the dotted lines 205 show regions where N+ diffusion into the underlying substrate forms an NMOS transistor. The N+ diffusion extends the node diffusion region 204 to form a drain which is adjacent to the word line and further a source 206 is formed in the substrate by diffusing N+ into the substrate in the area between the word line and the Vss (gnd) area where N+ diffusion is also present. The word line acts as a gate, which is electrically coupled through a dielectric, with a channel region of the NMOS transistor.

FIG. 2b shows transistors formed between bit line BL0 and word line WL1, and bit line BL0 and word line WL2 for example. It should be noted that the contact 202 and node diffusion area 204 can be used to create the NMOS transistors to adjacent word lines. For example, at node 401, bit line (BL4), and the diffusion region is used to create bit line NMOS transistors to WL0 and to WL1.

FIG. 2c shows a cross section of FIG. 2b taken along Line A—A at the bit line BL0. It should be noted that FIG. 2c is not to scale and is provided for generally illustrating the lay out of different elements of the ROM. In this case, the substrate 203 is a P type silicon substrate. Node 001 is shown having a node diffusion area 204 with N+ diffusion. This region 204 is present at each of the cells whether a transistor is coupled between the corresponding bit line and a word line. Areas 210 are shown adjacent to the node diffusion region 204 of node 001, and adjacent to the node diffusion region 204 of node 023. The regions 210 are areas of N+ diffusion; thus areas 210 in combination with areas 204 form a drain region for an NMOS transistor. Regions 212 are also areas with N+ diffusion. These regions 212 form sources for the NMOS transistors and these sources are coupled to Vss (gnd). The regions 213 form channels between the regions 210 and 212. The channel region can conduct electrical current when a voltage is applied to the adjacent word line, and is not conductive when no voltage is present on the word line. The cross sectional view of FIG. 2c shows transistors T10 (coupling BL0 to WL1) and T20 (coupling BL0 to WL2) as shown in FIG. 1. The word lines WL1 and WL2 act as gates for the transistors, and are electrically coupled, via an intervening gate oxide dielectric material 215 with the channel regions 213, such that when a voltage is applied to the word line the channel regions 213 become conductive, as discussed above.

FIG. 2d shows a cross section of FIG. 2b taken along Line B—B, i.e. along bit line BL3. As shown in FIG. 1, and FIGS. 2b and 2d no NMOS transistors are formed between the bit line BL3 and any of the word lines WL0–WL3. Although no NMOS transistors are formed along bit line BL3, each bit line still has a node diffusion region 204 with N type diffusion and a contact 202. Thus, the bit cell region 215 in the substrate 203 includes both the N type conductivity area of the node diffusion area 204 and the dielectric isolation region 209.

As shown above, the prior art ROM bit cells require the presence of the node diffusion area 204 and a contact 202, so that the ROM array can be programmed to achieve the desired connectivity which occurs when the diffusion node is extended during the programming of the ROM. For more advanced processes the node diffusion region 204, which is sometimes referred to as an "island", has a minimum area requirement specified by process design rules that are intended to ensure a high yield. This minimum area process rules will limit the minimum size of a ROM bit cell and limits the minimum area of the complete array of bit cells of the ROM. An example of this is shown in FIG. 2e and FIGS. 3a–c. Specifically, it can be seen that a minimum node diffusion area 207 has a significant effect on the overall size of the bit cells and the overall sized of the ROM. FIGS. 3a–c illustrate that the minimum node diffusion area 207 can take on various aspect ratios regarding the length and width of the node diffusion area.

SUMMARY

The present invention is directed to a ROM which allows for a reduced size by forming the ROM such that a contact and a node diffusion region are not present at all nodes of the ROM, and further provides for inverting the operation of a sensing circuit of the ROM which thereby allows the number of transistors in the bit cells to be reduced.

In one embodiment the ROM system provides a substrate having a plurality of columns of bit cells. The plurality of columns of bits cells includes a first column of bit cells, wherein a first bit cell in the first column of bit cells includes a first bit cell region disposed in the substrate, wherein a first transistor is disposed in the first bit cell region. A second bit cell is also included in the first column of bit cells, and it includes a second bit cell region disposed in the substrate, wherein the second bit cell region consists of an isolating dielectric region. A second column of bit cells is also provided, wherein a third bit cell of the second column of bit cells includes a third bit cell region disposed in the substrate, and the third bit cell region consists of an isolating dielectric region. A fourth bit cell of the second column of bit cells includes a fourth bit cell region disposed in the substrate, wherein a second transistor is formed in the fourth bit cell region. This embodiment also includes a sensing circuit coupled to the first column of bit cells, and to the second column of bit cells. In response to a voltage applied the first bit cell the sensing circuit detects a current flow through the first transistor and outputs a first signal, and in response to a voltage applied to the second bit cell the sensing circuit detects an absence of current in the second bit cell, and outputs a second signal. Further, in response to a voltage applied to the third bit cell, the sensing circuit detects an absence of current flow in the third bit cell and outputs the first signal, and when a voltage is applied to the fourth bit cell the sensing circuit detects current flow through the second transistor and outputs the second signal.

In another embodiment a ROM includes a substrate with bit cell regions. The ROM also includes a plurality of word lines and a plurality of bit lines. The plurality of word lines and the plurality of bit lines form intersection areas between the bit lines and the word lines, wherein the intersection areas form a plurality of nodes which correspond to the bit cell regions disposed in the substrate. A sensing circuit is coupled to the plurality of bit lines. There is a first bit cell region corresponding to a first node at an intersection area between a first bit line and a first word line, wherein a first transistor having a drain, a channel, and a source is disposed in the first bit cell region. A first contact couples the first bit line to the drain of the first transistor. There is also a second bit cell region corresponding to a second node at an intersection area between the first bit line and a second word line, wherein an insulating layer is disposed between the second bit cell region and the first bit line. The embodiment also includes a third bit cell region corresponding to a third node at an intersection area between a second bit line and a third word line, wherein a second transistor having a drain, a channel, and a source is disposed in the third bit cell region, and wherein a second contact couples the second bit line to drain of the second transistor. A fourth bit cell region corresponding to a fourth node at an intersection area between the second bit line and a fourth word line is also provide. An insulating layer is disposed between the fourth bit cell region and the second bit line. In response to a first voltage applied to the first word line the sensing circuit detects a first current flow through the first transistor and outputs a first signal, and in response to a second voltage applied to the second word line the sensing circuit detects an absence of current in the second bit cell region and outputs a second signal, and in response to a third voltage applied to the third word line the sensing circuit detects a second current flow through the second transistor and outputs the second signal, and in response to a fourth voltage applied to the fourth word line the sensing circuit detects an absence of current in the fourth bit cell region and outputs the first signal.

In another embodiment a ROM system for storing information in bit cells includes a substrate having a plurality of bit cell regions. The system includes a plurality of sectors, wherein each sector includes a plurality of columns of bit cells. The plurality of sectors includes a first sector which includes a first column of bit cells, wherein a first bit cell in the first column of bit cells includes a first bit cell region disposed in the substrate, wherein a first transistor is disposed in the first bit cell region. A second bit cell is also included in the first column of bit cells, and it includes a second bit cell region disposed in the substrate, wherein the second bit cell region consists of an isolating dielectric region. A second sector includes a second column of bit cells. The second column of bit cells includes a third bit cell region disposed in the substrate, wherein the third bit cell region consists of an isolating dielectric region, wherein a fourth bit cell of the second column of bit cells includes a fourth bit cell region disposed in the substrate, wherein a second transistor is formed in the fourth bit cell region. A sensing is coupled to the first column of bit cells, wherein in response to a voltage applied to the first bit cell the sensing circuit detects a current flow through the first transistor and outputs a first signal, wherein in response to a voltage applied to the second bit cell the sensing circuit detects an absence of current in the second bit cell, and outputs a second signal. A second sensing circuit is coupled to the second column of bit cells, wherein in response to a voltage applied to the third bit cell, the second sensing circuit detects an absence of current flow in the third bit cell and outputs the first signal, wherein when a voltage is applied to the fourth bit cell the second sensing circuit detects current flow through the second transistor and outputs the second signal.

The features and advantages of the present invention will be more fully appreciated upon consideration of the following detailed description of the invention and the accompanying drawings, which set forth an illustrative embodiment in which the principles of the invention are utilized.

BRIEF DESCRIPTION OF THE DRAWINGS

FIGS. 3a–d are views of aspects of a bit cell of a ROM.

FIG. 4a–d are views of a ROM array lay out of the present invention.

DETAILED DESCRIPTION

The approach herein combines the idea of forming contacts and diffusion areas for bit cells which have a transistor, with a ROM architecture which provides for inverting the operation of a sensing circuit, which thereby allows for a reduction in the number of transistors in the overall ROM array of bit cells. Reference is also made to a commonly assigned co-pending patent application entitled HIGH DENSITY ROM ARCHITECTURE (attorney docket NSC1-m 1500 application no. pending, and filed on the same day as this present application), which is incorporated herein in its entirety by reference.

Figure 2A:
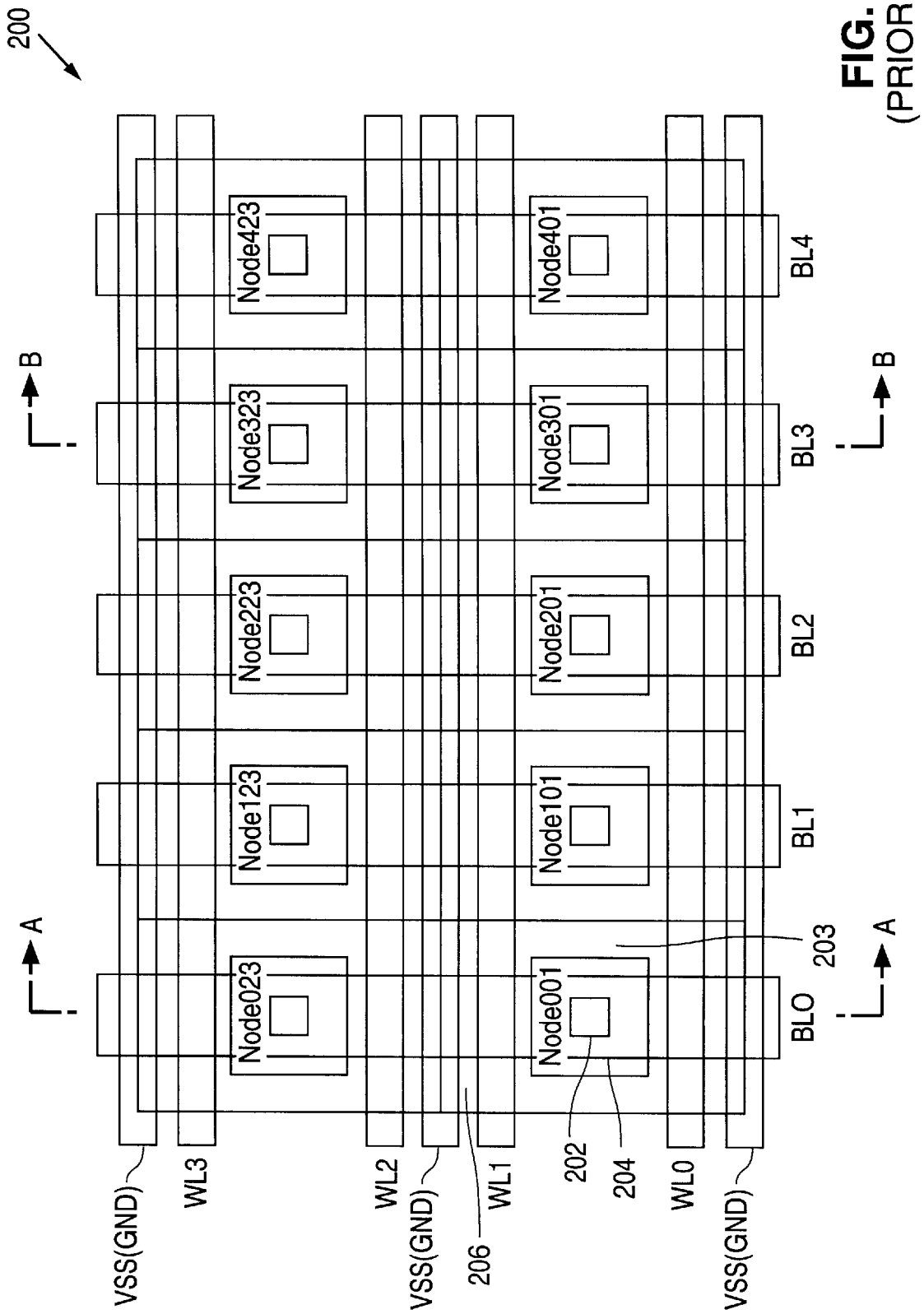
FIGS. 2a–e are views of a ROM array layout of the prior art.

The approach herein is based in part on utilizing the fact that a contact 202 and a node diffusion region 204 (see ROM 201 (FIG. 2a)), need not be created for those nodes where a transistor is not connected between a bit line and a word line. Aspects of the approach used herein can be understood by considering a substrate, word lines, bit lines and ground diffusion regions as shown in FIG. 4a. FIG. 4a shows a view of an unprogrammed ROM array 500 of the present invention—or it could be considered as a ROM where all the bit cells are programmed with a one (1) (i.e. there are no transistors connecting bit lines to word lines). In contrast with an unprogrammed ROM array of the prior art (see e.g. FIG. 2a) the nodes (Node 001–Node 423) of the unprogrammed array 500 do not have node diffusion areas 204 as are present in the prior art, nor does it have contact 202.

Figure 1:
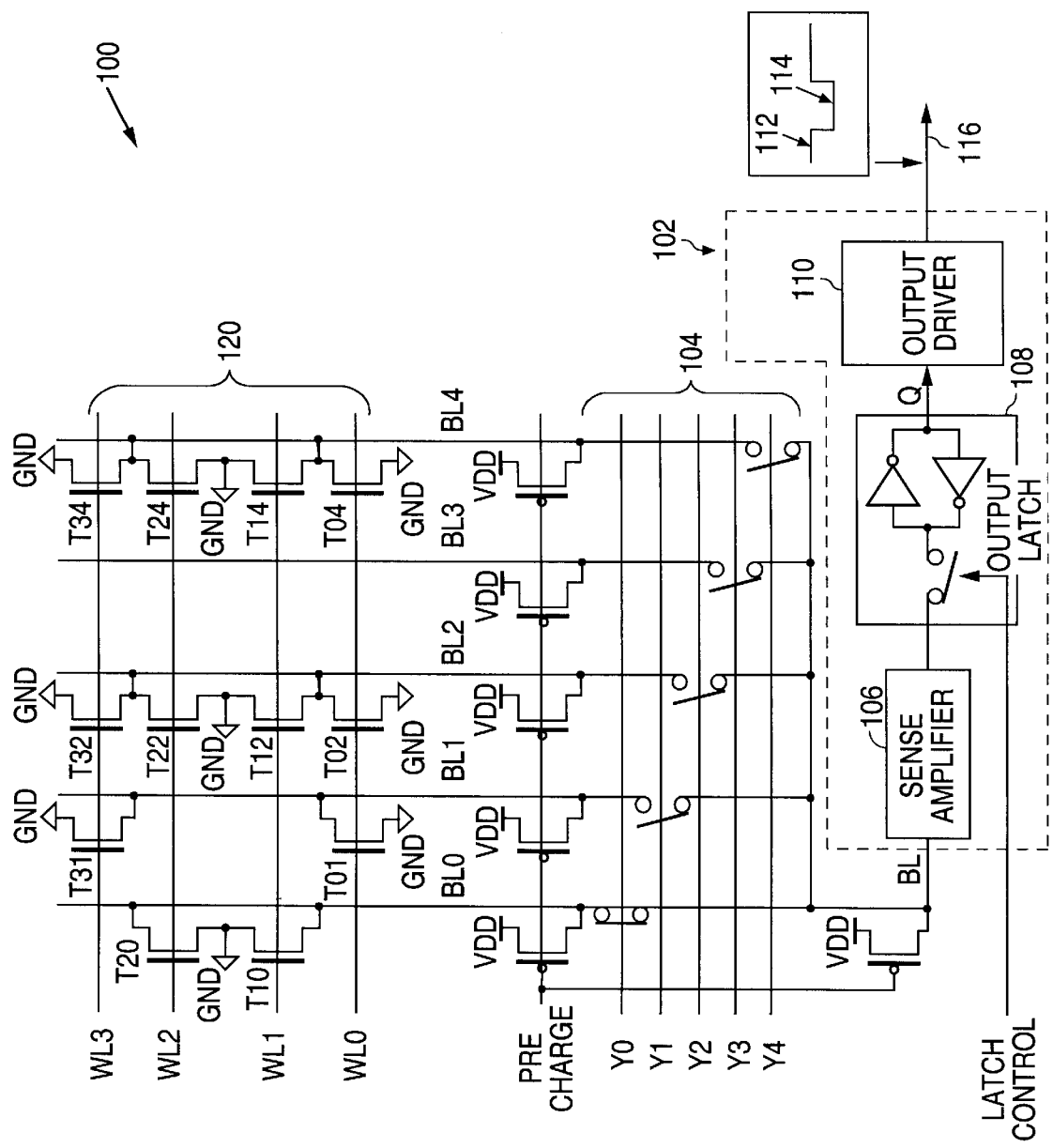
FIG. 1 is a view of a ROM array of the prior art.
Figure 4B:
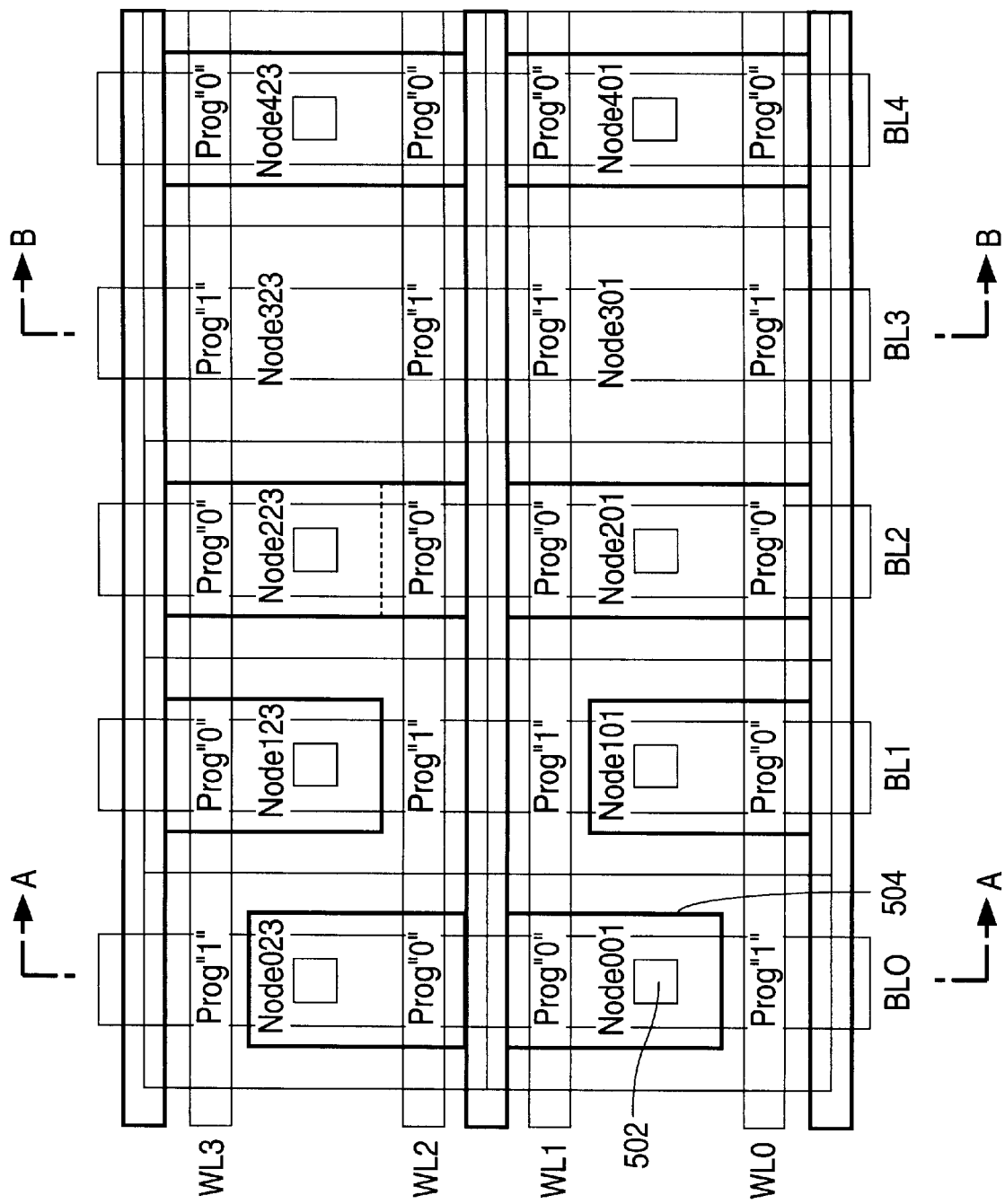

To program the ROM array, a memory compiler is provided which adds diffusion regions (node diffusion regions) and contacts only for those nodes which have a transistor between the bit line and a corresponding word line. With cells of the present invention a node does not have a minimum area rule for a node diffusion region when there is no transistor coupled to a bit line. FIG. 4b shows a ROM array which is programmed such that it stores the same information as shown in FIG. 1. As shown in FIG. 4b, contacts 502 are created for nodes where a transistor is created between the bit line and a corresponding word line, but there are no contacts where a transistor is not present between a corresponding word line and bit line. For example, no contacts are formed for bit line BL3 (nodes 301 and 323).

Figure 2B:
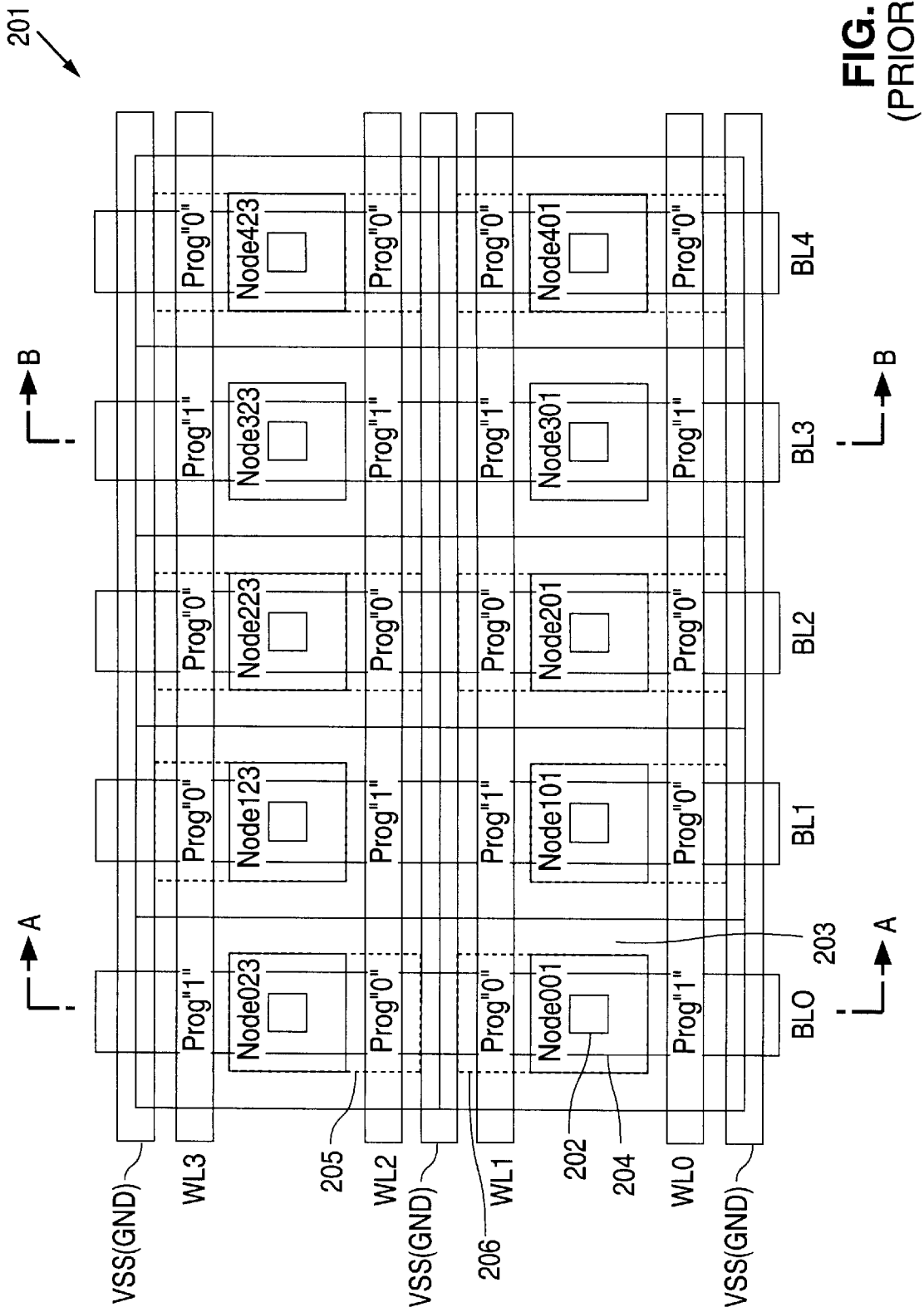
Figure 2C:
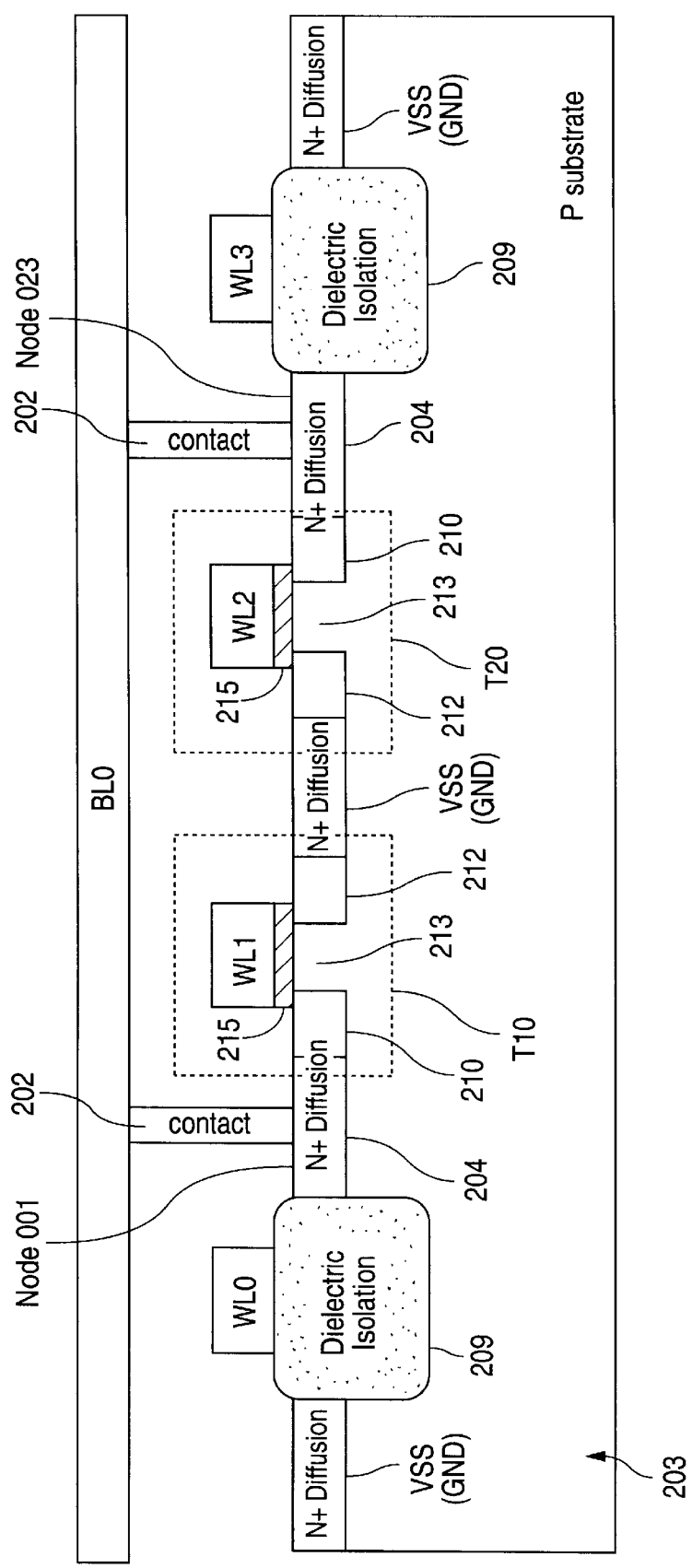
Figure 2D:
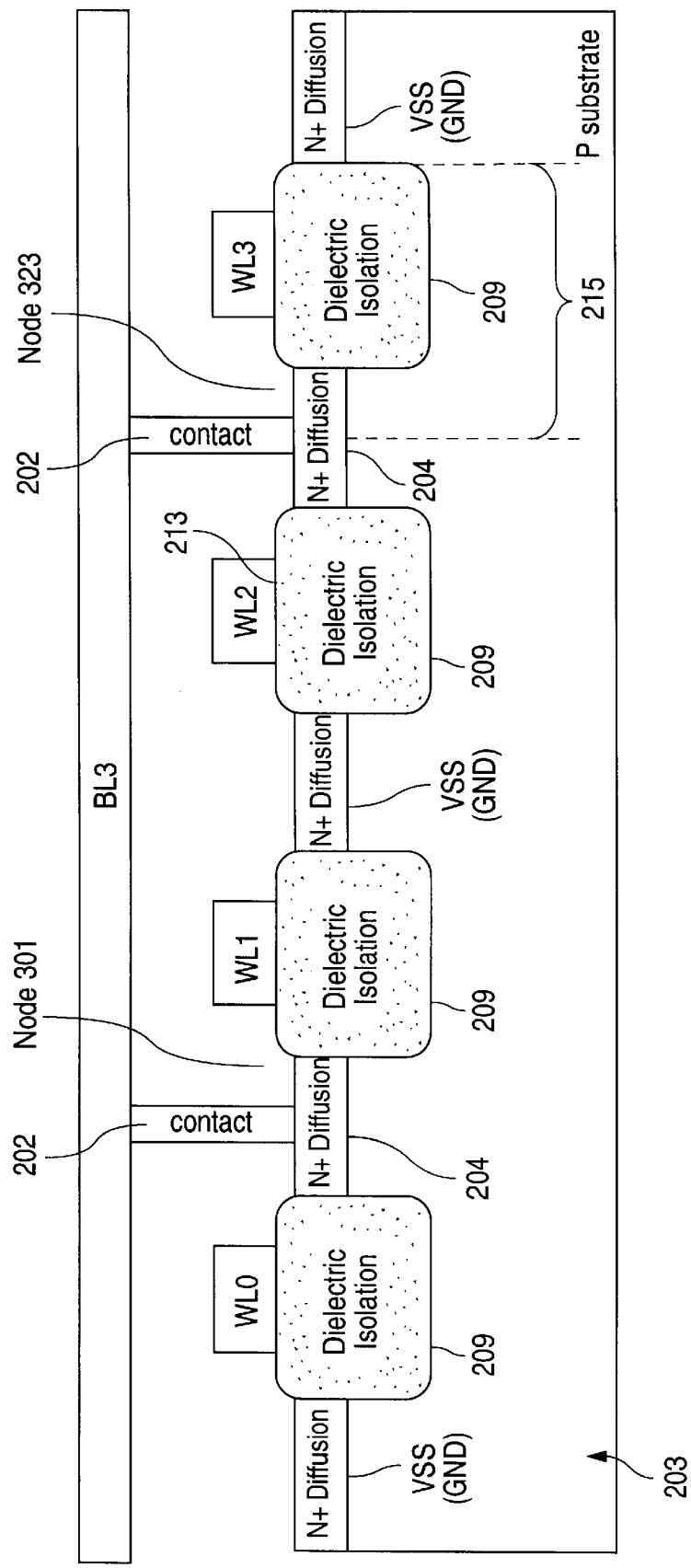
Figure 2E:
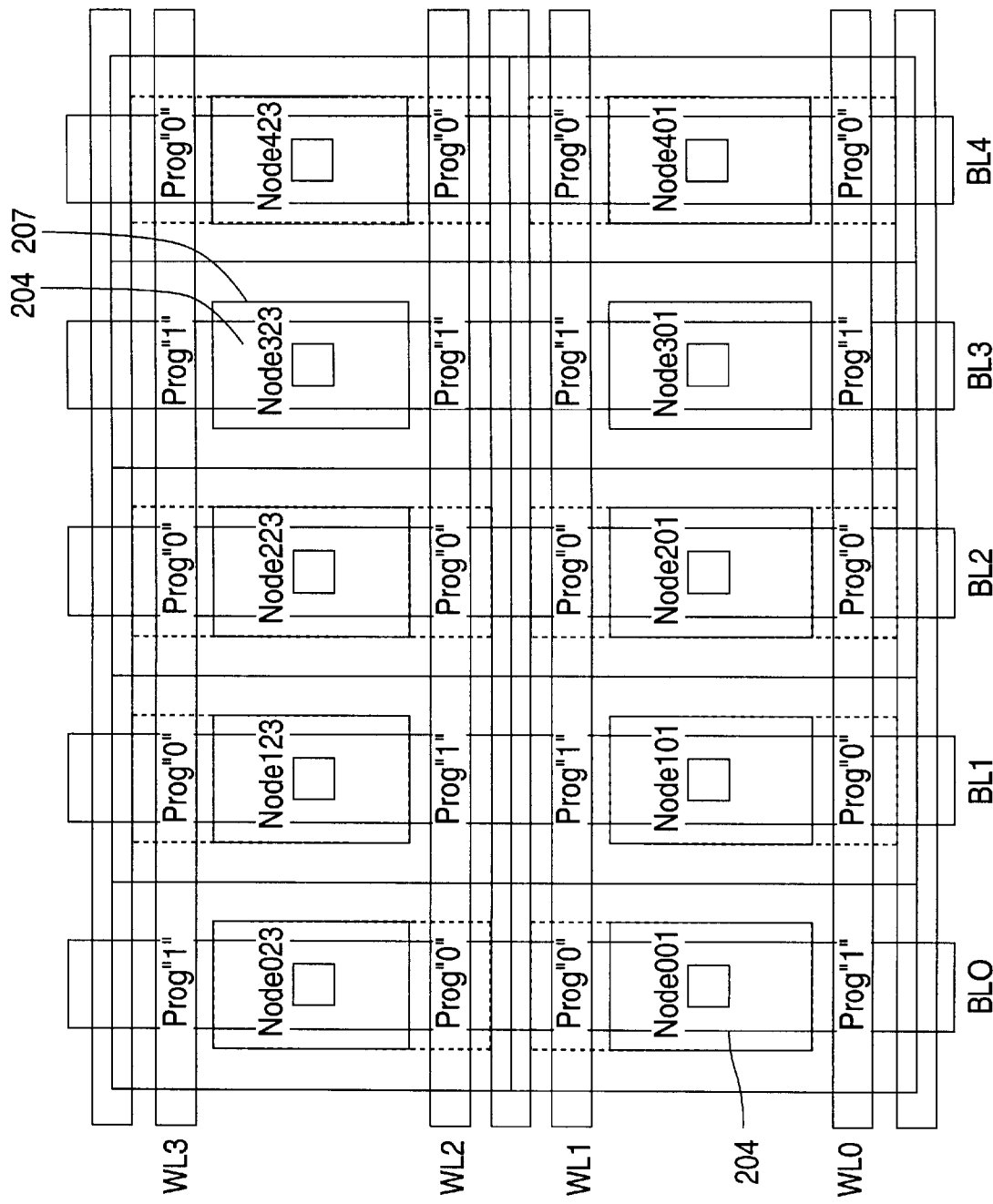
Figure 4C:
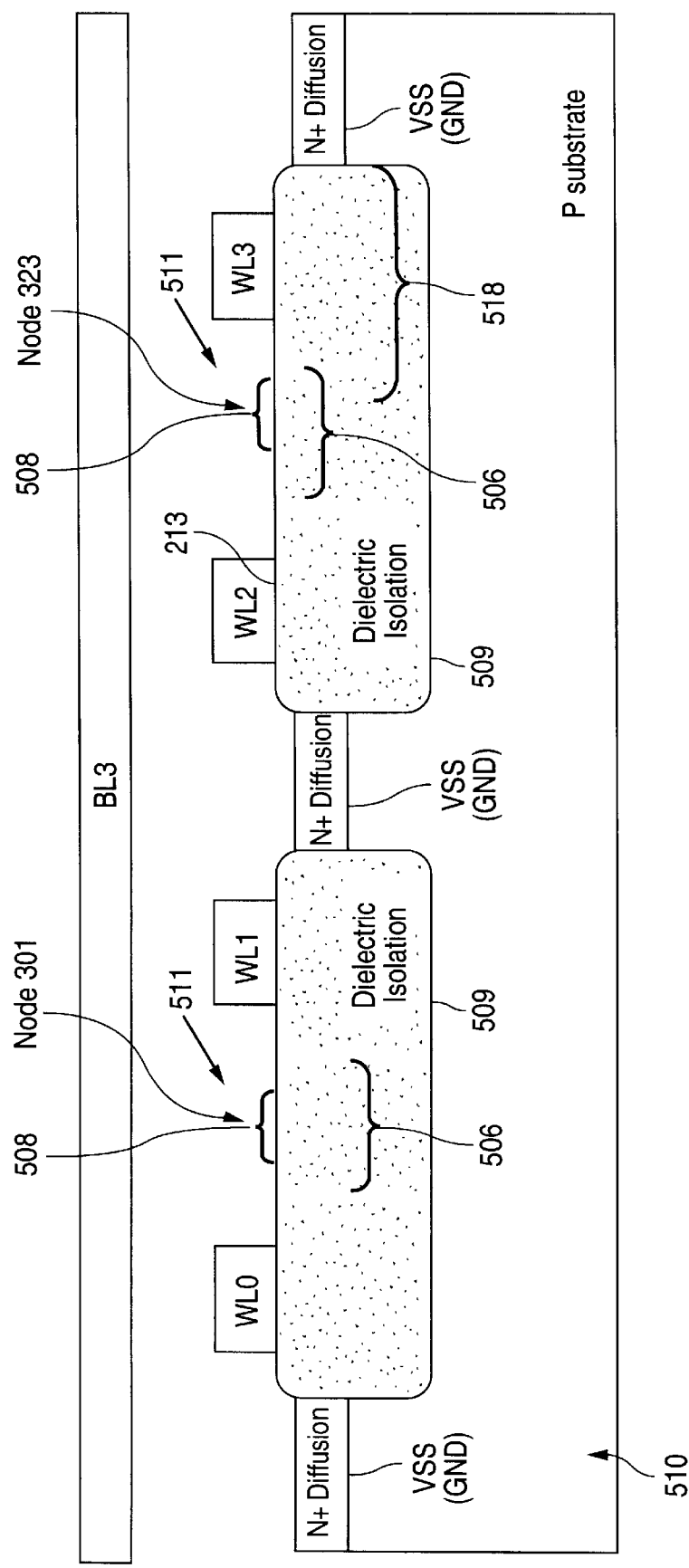

FIG. 4c shows a cross section Line B—B taken along bit line BL3 of FIG. 4b. As shown in FIG. 4c, node 323 corresponds to an intersection area between bit line BL3 and word lines WL2 and WL3. Bit cell regions are formed in the substrate in areas under the bit lines and the word lines. For example, the bit cell region 518 corresponds to the region where a transistor would be formed if BL3 and WL3 were coupled with a transistor. However, as shown in FIG. 4c there are no transistors coupling the bit line BL3 with the word lines WL0–WL3. In FIG. 4c in a region 506 there is no node diffusion region with N+ diffusion as is present in the prior art, which is shown in FIG. 2d. Also as shown in FIG. 4c, in a second region 508 there is no contact formed for coupling the bit line BL3 with a node diffusion region as is present in the prior art, which is shown in FIG. 2d. As shown in FIG. 4c the bit line BL3 is separated from the bit cell regions by an insulating layer 511 formed of a material such as silicon oxide or other suitable non-conductive material as is known in the art. As shown in FIG. 4c the region 506 and the areas adjacent to it are electrically isolated using a dielectric isolation region 509. As is known in the art the dielectric isolation regions 509 can be formed using shallow trench isolation techniques, or using LOCOS field oxidation techniques. Thus, the bit cell region 518 disposed in the substrate 510 from an area adjacent to where a contact would be formed if a contact were present at Node 323 to an area adjacent to the VSS (gnd area) substantially consists of the dielectric isolation region, whereas in a prior art ROM the bit cell region 215 (see FIG. 2d) includes both a node diffusion region 204 as well as a dielectric isolation region. When a voltage is applied to the corresponding word line no current will be detected on bit line BL3. Specifically, if a voltage is applied to WL3 no current will result on BL3, as there is no transistor connected between BL3 and WL3.

Figure 4D:
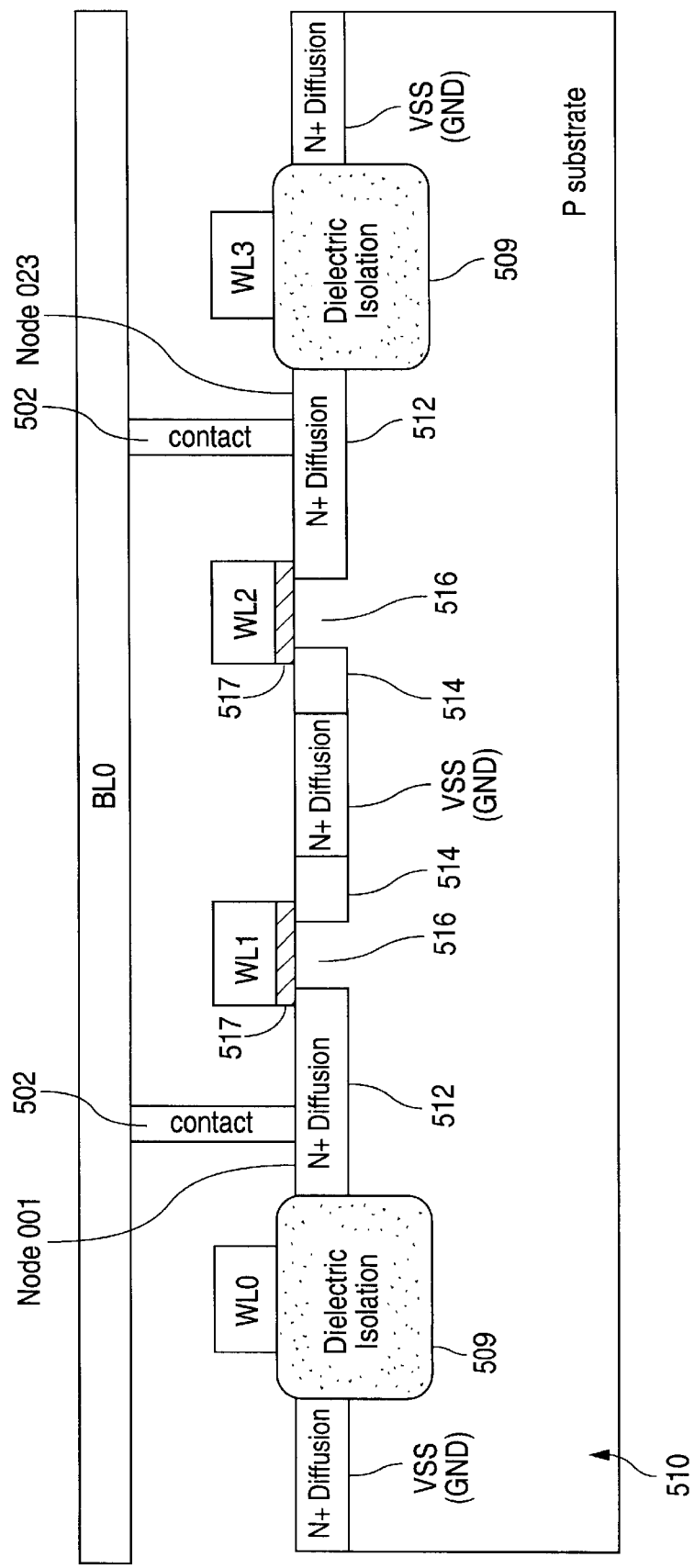

FIG. 4d shows a cross section Line A—A from FIG. 4b taken along bit line BL0. The diffusion regions 512 are regions where N+ diffusion is present. The regions 512 form drains for NMOS transistors. Note that unlike the drain areas of the prior art shown in FIG. 2c, which include the node diffusion areas 204 and then subsequently formed diffusion areas 210, the entire region 512 is formed during a single diffusion step. Simultaneously with the formation of the drain regions 512 the source regions 514 are also formed, with the source regions also including N type diffusion. The fact that the entire drain regions and source region are formed during a single process is reflected in FIG. 4b which shows the drain and source region as being continuous line 504 as opposed to the dotted line shown in FIG. 2b. The source regions 514 are coupled to the Vss (gnd) regions thereby coupling the resulting NMOS transistor to ground. Thus, the drain and source regions are formed to be N type conductivity, and disposed in a P type substrate 510, and form an NMOS transistor. In addition to the creation of the source 514 and 512 drain regions the contacts 502 are formed to couple the bit line BL0 with the drain regions 512. These contacts 502 are formed after the N+ diffusion has formed the source 514 and drain 512 regions. When a voltage is applied to WL1, for example, the word line operates as a gate coupled to the channel region 516, via a dielectric layer 517, to cause the channel to allow for the flow of current between the source 514 and drain 512 of the transistor at node 001 which couples bit line BL0 to word line WL1.

Figure 5A:
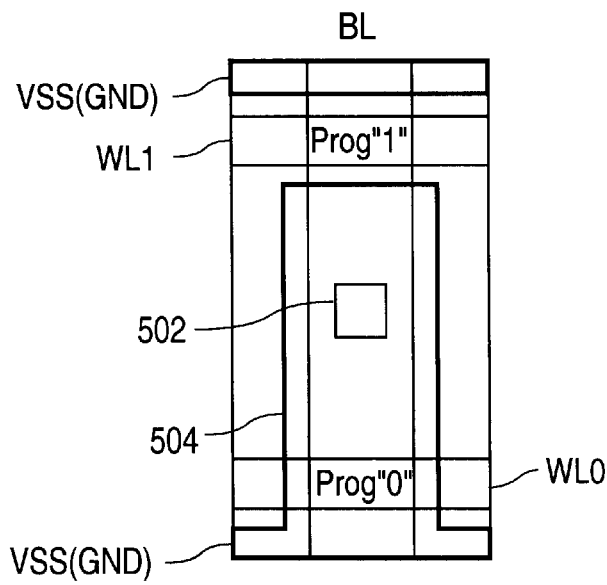
FIGS. 5a–d are views of bit cells of a ROM of the present invention.
Figure 5B:
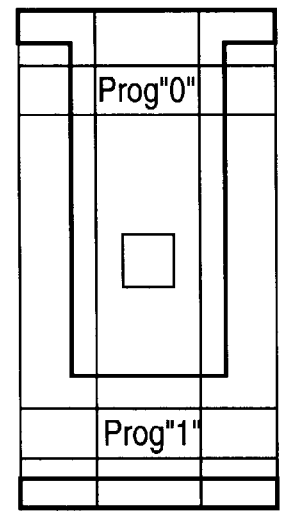
Figure 5C:
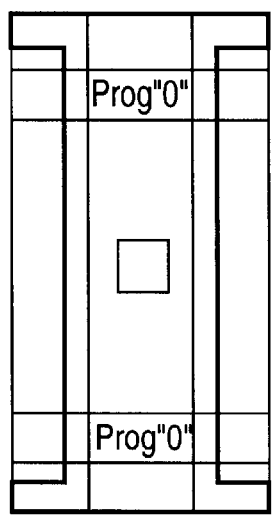
Figure 5D:
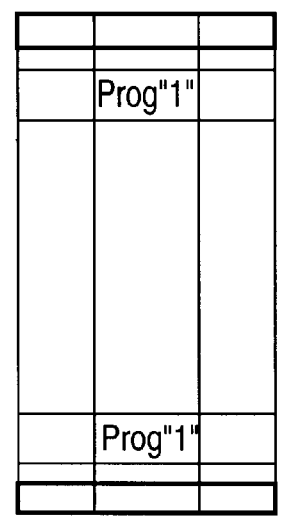

By forming the entire drain region during a single process the need to meet a minimum area rule as described above in connection with the prior art is not required. FIGS. 5a–d show the four possible programming states for a node. FIG. 5a shows a situation where an NMOS transistor is connected between the bit line BL and the word line WL0, and this transistor corresponds to a 0 being programmed between BL and WL0. The diffusion area is shown as 504 and the contact is shown as 502. FIG. 5b shows a transistor between the bit line BL and the word line WL1. FIG. 5c shows a situation where a one transistor is connected between BL and WL0, and a second transistor is connected between BL and WL1. FIG. 5d shows a node programmed such that there is no transistor between BL and WL0 (this cell is programmed 1) and there is no transistor between BL and WL1 (this cell is also programmed 1).

FIG. 3*d* illustrates a node which has been laid out with no constraint for minimum node diffusion area. For illustrative purposes FIG. 3*d* can be considered relative to the bit cells shown in FIGS. 3*a*–*c*. As shown in FIGS. 3*a*–*c*, the prior art nodes have a node diffusion area 204, and then in a subsequent diffusion step the N+ diffusion regions form the drain and the source. As shown in FIGS. 3*a*–*c* additional regions of N+ diffusion, for the drain and the source, are shown by the dotted lines. In contrast, for the bit cells of the present invention there is no node diffusion region where there is no transistor coupling the bit line to a word line. In the present invention, when the N+ diffusion is formed in a drain region 302 and a source region 304 this diffusion can be done during a single step, thus obviating the need for a minimum node diffusion region, and thereby allowing the overall size of the bit cells, nodes, and overall ROM array to be reduced.

By creating node diffusion regions and contacts only for those nodes where a transistor is to be connected between a bit line and a word line, current processes for fabricating a ROM array can yield an overall size reduction of greater than 15%. Further, by not creating node diffusion regions and contacts for those nodes where transistors are not connected between the bit line and the word line the overall capacitance of the ROM array is reduced. This lower capacitance is a result of the overall size reduction of the bit cells and the fact that a number of contacts in the ROM array is reduced. The lower capacitance and smaller size results in lower active power dissipation in the memory than is seen in prior art ROM arrays.

The advantages discussed above in connection with forming contacts and providing N+ diffusion areas only at those nodes and bit cells where transistors are formed can be further utilized by analyzing ROM code used in conjunction with programming the array of bit cells to determine if the number of NMOS transistors for a given sector of bit cells coupled to a mux is such that more than half of the bit cells in the sector of bit cells would contain NMOS transistors, if the standard programming of a transistor at a bit cell corresponding to a 0 were followed. If this is the case then the programming for the given sector of bit cells is inverted, and the output of a sensing circuit is also inverted relative to other sectors of bit cells where the programming of the bit cells is not inverted. The advantages of this system can be understood in conjunction with embodiments of the present invention shown FIGS. 6, 7 and 8, relative to a prior art system as shown in FIGS. 1 and 2.

As discussed above, FIG. 1 shows a view of a prior ROM system 100. Specifically, FIG. 1 can be viewed as showing a sector of a plurality of sectors in a ROM system. As shown in FIG. 1 the array of bit cells 120 in the ROM 100 has been programmed with NMOS transistors disposed at nodes of the ROM. The transistors are shown as T10, T20, T01, T02 etc. In order to read the data stored in the bit cells the Sensing circuit 102 is coupled to the bit lines BL0, BL1, BL2, BL3, and BL4 by a multiplex circuit (MUX) 104. The sensing circuit includes a sense amplifier 106, an output latch 108, and an output driver 110. As voltages are applied to the different bit cells via the word lines WL0–WL3, the sensing circuit is selectively coupled to different bit lines via the mux 104. If current is detected by the sensing circuit in response to a voltage being applied the bit cell via one of the word lines then the sensing circuit outputs a first signal corresponding to a 0, and if no current is detected then a second signal is output corresponding to 1. For example at the output 116 a first signal 112 is shown at a high voltage signal corresponding to a 1 when a bit cell is read which does not have a transistor coupling the bit line to the word line for example, at the bit cell between BL0 and WL3. In contrast at the output 116 a second signal 114 is shown having a low voltage corresponding to a 0 when a bit cell is read which does have a transistor coupling the bit line to the word line; for example at the bit cell between BL0 and WL2. As shown in FIG. 1 more than half of the bit cells in the ROM array include transistors.

Figure 6:
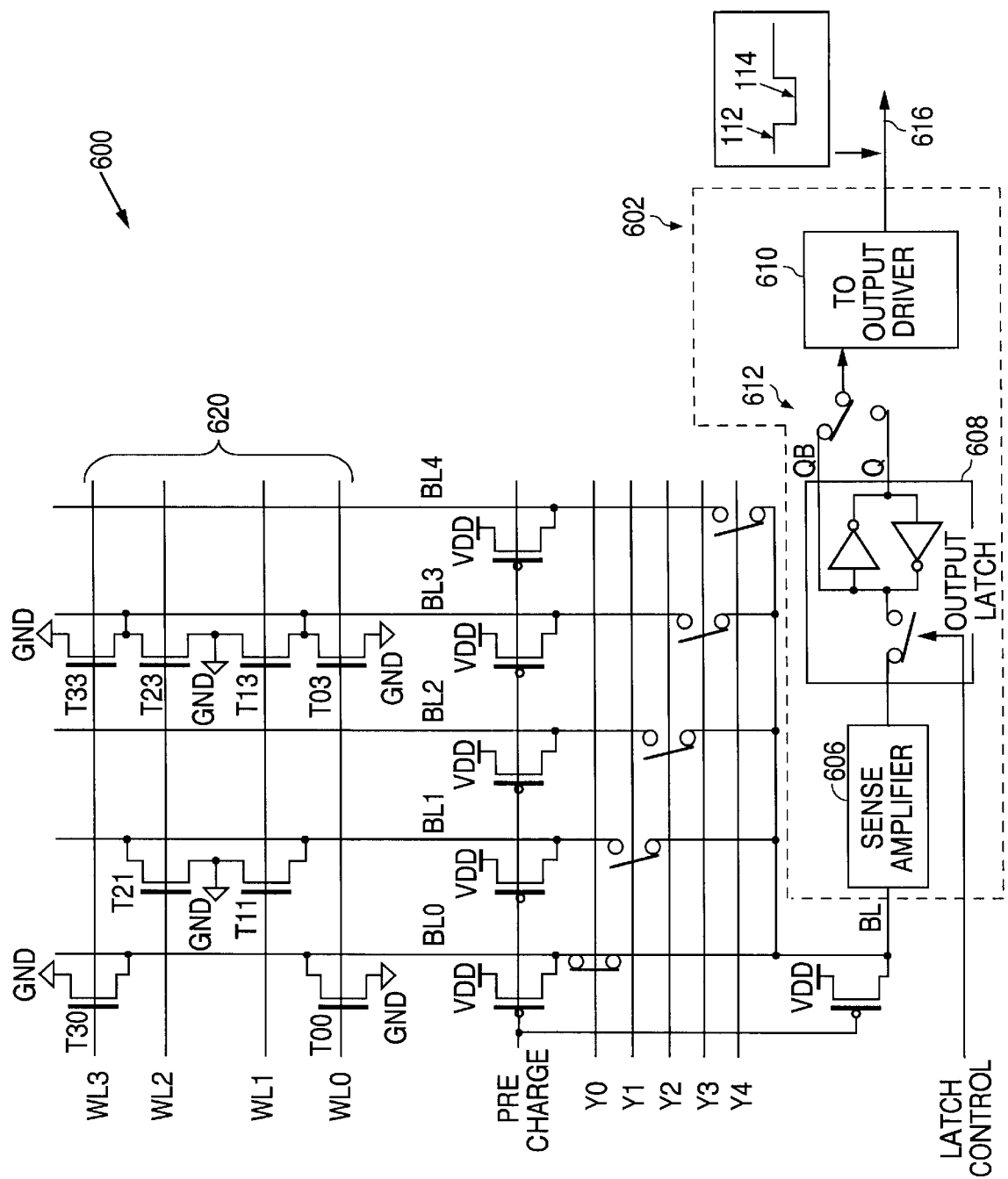
FIG. 6 is a view of a ROM system of the present invention.

Now reference is made to FIG. 6 showing a ROM sector 600 which outputs the same information, as ROM sector 100 of FIG. 1, as a result of sensing the array of bit cells 620, but the configuration of the bit cells in the array 620 is inverted, relative to the array 120, such that fewer than half of the bit cells include transistors. Specifically, for the bit cell array 620 shown in FIG. 6, each of the bit cells which did not have a transistor in the bit cell array of FIG. 1, are shown as having bit cells, and conversely those bit cells which had transistor in the sector of FIG. 1, do not have transistors in the sector 600 shown in FIG. 6. Thus, the sector 600 is referred to as being inverted relative to the sector of FIG. 1.

The sector 600 utilizes an additional output QB from the output of a latch circuit 608 of the sensing circuit 602. When the sensing circuit 602 senses a signal from a bit cell in the array of bit cells 620, the switch 612 routes the QB output to the output driver circuit 610 instead of the Q output. Thus, for a bit cell which is inverted, the output driver circuit 610 will receive an input signal QB which is inverted relative to the signal Q which is used for the non-inverted bit cells. Thus, the switch 612 in combination with the output latch 608 operates as an inverting circuit. For an inverted sector, if a transistor is disposed in a bit cell then the sensing circuit would output a signal indicating that the bit cell being sensed stores a 1, whereas in the sector which is not inverted the Q output from the latch circuit would be input to the output driver by the switch 612, and if no transistor is present in a bit cell being sensed (hence no current sensed at the bit cell) then the output 616 from the output driver 610 would indicate that a 1 was stored in the bit cell. A similar result would occur in the sector 600 for a bit cell which did not have a transistor between a word line and bit line, except that for such a cell the output 616 from the output driver 610 of the sensing circuit 602 would indicate that a 0 was stored in the bit cell.

Figure 7:
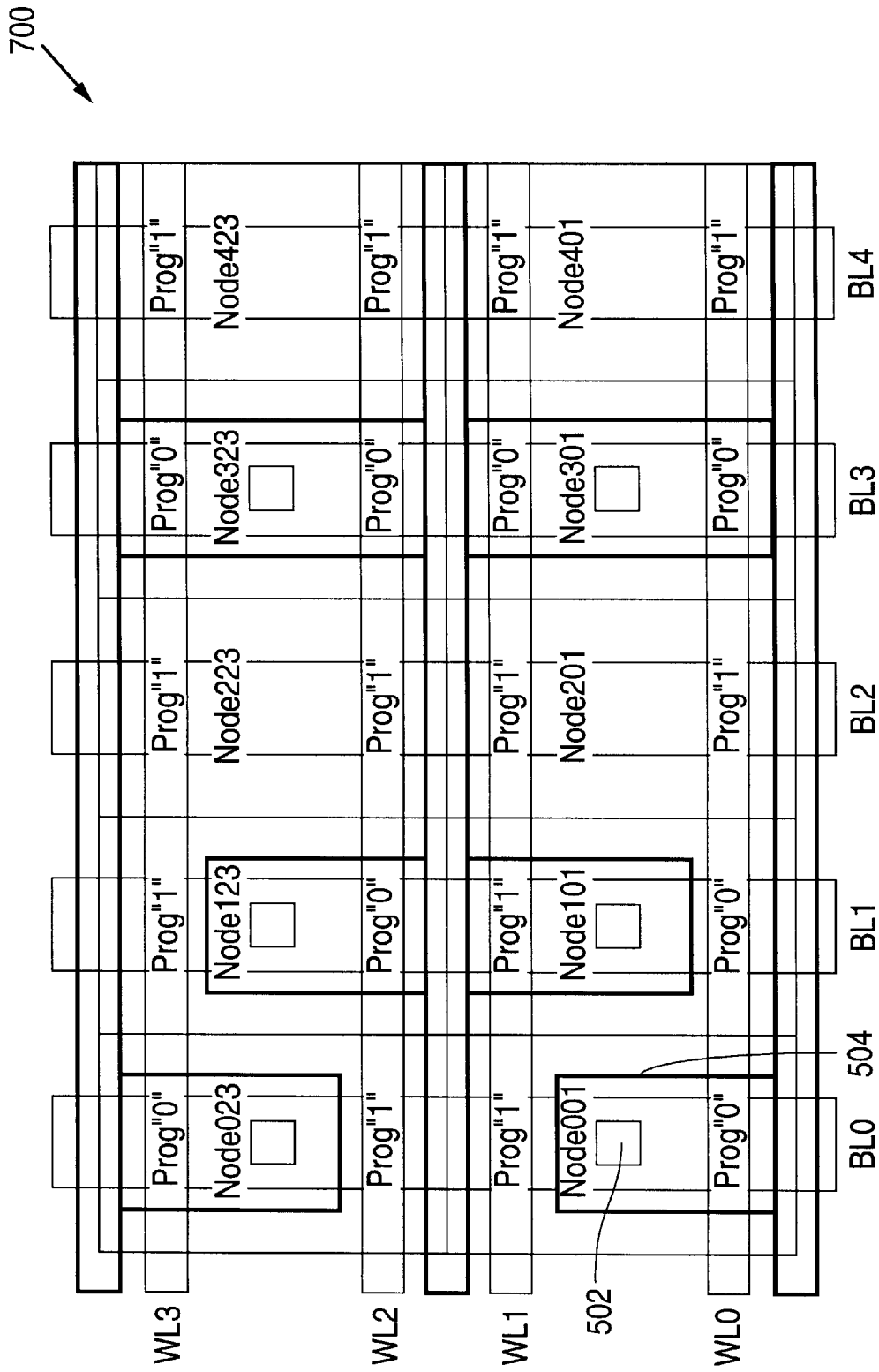
FIG. 7 is a view of a ROM array of the present invention.

FIG. 7 shows the lay out of the array of bit cells 700 shown schematically in FIG. 6 as 620. Comparison of FIG. 7 to FIG. 4*b* shows the advantage of inverting the programming of the array of bit cells. In that FIG. 7 shows that by inverting the array of bit cells the total number of contacts 502 at the nodes (Node 001–Node 423) is reduced from 8 contacts to 6 contacts and the total number of transistor in the bit cells is reduced from 12 to 8. This reduction in the number of transistors and contacts reduces the overall capacitance and power consumption associated with reading the information stored in the bit cell.

Figure 8:
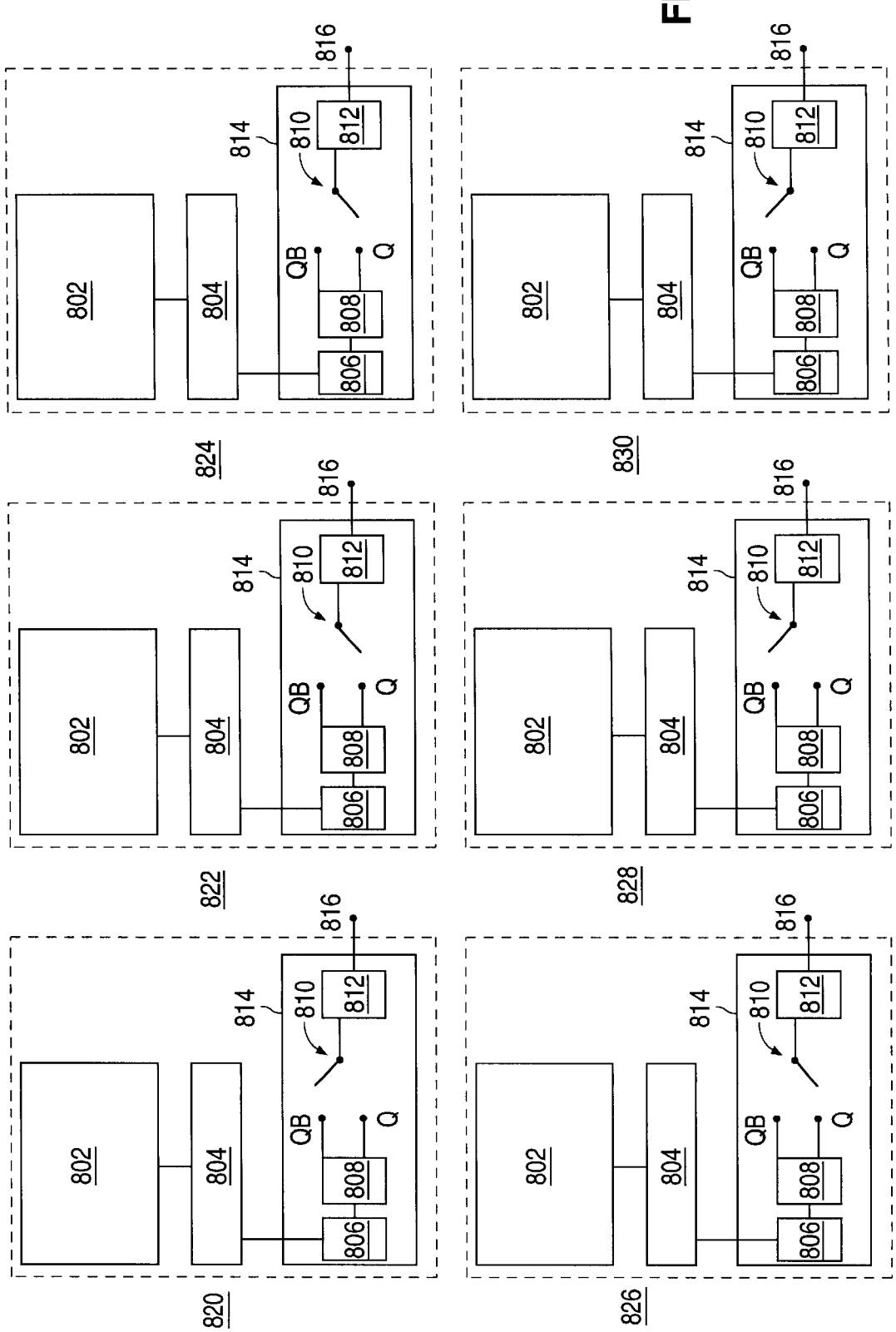
FIG. 8 is a view of a ROM system of the present invention.

FIG. 8 shows a ROM system 800 which includes a number of sectors (820, 822 . . . 830). These arrays of bit cells 802 of the sectors are formed having bit cells and nodes as discussed above, wherein contacts and N+ diffusion areas are formed only for instances where a transistor is disposed in the bit cell region in the substrate. These arrays are coupled to sensing circuits 814 by a mux 804. As can be seen the switches 810 for sectors 820, 828 and 830 are in position route the QB to the output driver circuit of the sensing circuits 814. In contrast the switches 810 for sectors 822, 824, 826 are positioned to route the Q output from the output latch circuit 808 to the output driver circuits 812. The arrays of bit cells 802 of the sectors 820, 828 and 830 are inverted. By routing the output latch circuit 808 QB output to the output driver 812 the signal output 816 provides appropriate signals indicating whether a 1 or 0 is stored in a bit cell. By analyzing the ROM code prior to programming the arrays of bit cells 802, the arrays of bit cells for a given sector can be inverted, or not, in order to ensure that none of the sectors 802 have more than half of the bit cells with a transistor formed therein.

It should be recognized that a number of variations of the above described embodiments would be obvious to one of skill in the art. For example, one variation would be to use PMOS type transistors, where the diffusions regions would include P type diffusion and the substrate would be N type. Further, FIG. 8 could be viewed as collectively showing a single sensing circuit coupled to the plurality of sectors or arrays of bit cells. Additionally, this same approach could be used to determine whether columns of bit cells should be inverted relative to other columns of bit cells. In some cases, depending on whether a column of bit cells being sensed is inverted or not, the position of the switch of the sensing circuit could be dynamically changed as information from different columns of bit cells are being sensed (read) by the sensing circuit. In light of the numerous possible configurations which could be implemented to take advantage of the invention herein, it should be recognized that although specific embodiments and methods of the present invention are shown and described herein, this invention is not to be limited by these specific embodiments. Rather, the scope of the invention is to be defined by the following claims and their equivalents.

What is claimed is:

1. A ROM system for storing information in an array of bit cells, the system including:
   a substrate;
   a plurality of columns of bit cells;
   wherein the plurality of columns of bits cells includes a first column of bit cells, wherein a first bit cell in the first column of bit cells includes a first bit cell region disposed in the substrate, wherein a first transistor is disposed in the first bit cell region, wherein a second bit cell in the first column of bit cells includes a second bit cell region disposed in the substrate, wherein the second bit cell region consists of an isolating dielectric region;
   wherein the plurality of columns of bit cells includes a second column of bit cells, wherein a third bit cell of the second column of bit cells includes a third bit cell region disposed in the substrate, wherein the third bit cell region consists of an isolating dielectric region, wherein a fourth bit cell of the second column of bit cells includes a fourth bit cell region disposed in the substrate, wherein a second transistor is formed in the fourth bit cell region;
   a sensing circuit wherein the sensing circuit is coupled to the first column of bit cells, and to the second column of bit cells, wherein in response to a voltage applied the first bit cell the sensing circuit detects a current flow through the first transistor and outputs a first signal, wherein in response to a voltage applied to the second bit cell the sensing circuit detects an absence of current in the second bit cell, and outputs a second signal, wherein in response to a voltage applied to the third bit cell, the sensing circuit detects an absence of current flow in the third bit cell and outputs the first signal, wherein when a voltage is applied to the fourth bit cell the sensing circuit detects current flow through the second transistor and outputs the second signal.

2. The ROM of claim 1 further including:
   a plurality of columns of bit lines;
   wherein a first bit line of the columns of bit lines corresponds to the first column of bit cells;
   wherein the first transistor includes a drain region, a channel region, and a source region disposed in the first bit cell region; and
   a first contact which couples the first bit line with the drain region of the first transistor.

3. The ROM of claim 2 further including an insulating region disposed between the first bit line and the second bit cell region.

4. The ROM of claim 1 further including:
   a plurality of sectors of bit cells, wherein the plurality of sectors of bit cells includes a first sector of bit cells and the first column of bit cells is included in the first sector of bit cells; and
   wherein the plurality of sectors of bit cells includes a second sector of bit cells and the second column of bit cells is included in the second sector of bit cells.

5. The ROM of claim 4 wherein no more than half of the bit cells in each of the plurality of sectors of bit cells have bit cell regions which include transistors.

6. The ROM of claim 1 further including:
   a mux circuit coupled to the sensing circuit and to the plurality of bit lines;
   wherein the mux circuit includes a plurality of switches whereby the sensing circuit can be selectively coupled to each of the plurality of bit lines;
   the sensing circuit further includes an inverting circuit, wherein the inverting circuit inverts signals sensed at bit cells in the second column of bit cells relative to the signals sensed at the bit cells in the first column of bit cells.

7. The ROM of claim 1 wherein the sensing circuit includes a first sensing circuit coupled to the first column of bit cells, and a second sensing circuit coupled to the second column of bit cells.

8. A ROM for storing information including:
   a substrate with bit cell regions disposed therein;
   a plurality of word lines;
   a plurality of bit lines wherein the plurality of word lines and the plurality of bit lines form intersection areas between the bit lines and the word lines, wherein the intersection areas form a plurality of nodes which correspond to the bit cell regions disposed in the substrate;
   a sensing circuit coupled to the plurality of bit lines;
   a first bit cell region corresponding to a first node at an intersection area between a first bit line and a first word line, wherein a first transistor having a drain, a channel, and a source is disposed in the first bit cell region, and wherein a first contact couples the first bit line to the drain of the first transistor;
   a second bit cell region corresponding to a second node at an intersection area between the first bit line and a second word line, wherein an insulating layer is disposed between the second bit cell region and the first bit line;
   a third bit cell region corresponding to a third node at an intersection area between a second bit line and a third word line, wherein a second transistor having a drain, a channel, and a source is disposed in the third bit cell region, and wherein a second contact couples the second bit line to drain of the second transistor;

a fourth bit cell region corresponding to a fourth node at an intersection area between the second bit line and a fourth word line, wherein an insulating layer is disposed between the fourth bit cell region and the second bit line; and wherein in response to a first voltage applied to the first word line the sensing circuit detects a first current flow through the first transistor and outputs a first signal, and in response to a second voltage applied to the second word line the sensing circuit detects an absence of current in the second bit cell region and outputs a second signal, and in response to a third voltage applied to the third word line the sensing circuit detects a second current flow through the second transistor and outputs the second signal, and in response to a fourth voltage applied to the fourth word line the sensing circuit detects an absence of current in the fourth bit cell region and outputs the first signal.

9. The ROM of claim 8 wherein the second bit cell region and the fourth bit cell region consist of an insolating dielectric material.

10. The ROM of claim 8 wherein the plurality of bit lines correspond to a plurality of columns of bit cell regions.

11. The ROM of claim 10 wherein the plurality of columns of bit cell regions include transistors disposed in no more than half the bit cell regions.

12. The ROM of claim 8 further including:

a mux circuit coupled to each of the plurality of bit lines and coupled to the sensing circuit, the mux including a plurality of switches which operate to selectively couple the sensing circuit to the plurality of bit lines.

13. The ROM of claim 8 wherein the sensing circuit includes an inverting circuit, wherein the inverting circuit operates to invert signals sensed at a bit cell regions corresponding to the first bit line relative to signals sensed at bit cell regions corresponding to the second bit line.

14. A ROM system for storing information in bit cells, the system including:

a substrate having a plurality of bit cell regions;

a plurality of sectors, wherein each sector includes a plurality of columns of bit cells;

wherein the plurality of sectors includes a first sector which includes a first column of bit cells, wherein a first bit cell in the first column of bit cells includes a first bit cell region disposed in the substrate, wherein a first transistor is disposed in the first bit cell region, wherein a second bit cell in the first column of bit cells includes a second bit cell region disposed in the substrate, wherein the second bit cell region consists of an isolating dielectric region;

wherein the plurality of sectors includes a second sector which includes a second column of bit cells, wherein a third bit cell of the second column of bit cells includes a third bit cell region disposed in the substrate, wherein the third bit cell region consists of an isolating dielectric region, wherein a fourth bit cell of the second column of bit cells includes a fourth bit cell region disposed in the substrate, wherein a second transistor is formed in the fourth bit cell region;

a first sensing circuit wherein the first sensing circuit is coupled to the first column of bit cells, wherein in response to a voltage applied to the first bit cell the sensing circuit detects a current flow through the first transistor and outputs a first signal, wherein in response to a voltage applied to the second bit cell the sensing circuit detects an absence of current in the second bit cell, and outputs a second signal;

a second sensing circuit wherein the second sensing circuit is coupled to the second column of bit cells, wherein in response to a voltage applied to the third bit cell, the second sensing circuit detects an absence of current flow in the third bit cell and outputs the first signal, wherein when a voltage is applied to the fourth bit cell the second sensing circuit detects current flow through the second transistor and outputs the second signal.

15. The ROM system of claim 14 further including:

a plurality of columns of bit lines;

wherein a first bit line of the columns of bit lines corresponds to the first column of bit cells;

wherein the first transistor includes a drain region, a channel region, and a source region disposed in the first bit cell region; and a first contact which couples the first bit line with the drain region of the first transistor.

16. The ROM of claim 15 further including an insulating region disposed between the first bit line and the second bit cell region.

17. The ROM of claim 14 wherein no more than half of the plurality of bit cell regions have transistors disposed therein.

* * * * *